United States Patent

Huang

[11] Patent Number: 5,814,122
[45] Date of Patent: Sep. 29, 1998

[54] METHOD OF MAKING HOLLOW HIGH TEMPERATURE CERAMIC SUPERCONDUCTING FIBERS

[75] Inventor: Jianzhong Huang, Westerville, Ohio

[73] Assignee: Owens-Corning Fiberglas Technology, Inc., Summit, Ill.

[21] Appl. No.: 571,061

[22] Filed: Dec. 12, 1995

[51] Int. Cl.$^6$ ................................................ C03B 37/022
[52] U.S. Cl. ................................ 65/393; 65/439; 65/405; 65/444; 65/187; 505/420; 505/430; 505/450; 505/740
[58] Field of Search ................................ 65/393, 439, 376, 65/445, 405, 502, 494, 444, 187; 505/420, 430, 450, 740

[56] References Cited

U.S. PATENT DOCUMENTS

| | | | |
|---|---|---|---|
| 4,023,953 | 5/1977 | Megles | 65/187 |
| 4,975,416 | 12/1990 | Onishi | 505/420 |
| 5,037,800 | 8/1991 | Iijima | 505/420 |

FOREIGN PATENT DOCUMENTS

| | | | |
|---|---|---|---|
| 6489217 | 4/1989 | Japan | 505/740 |
| 1176610 | 7/1989 | Japan | 505/740 |
| 2181315 | 7/1990 | Japan | 505/740 |

OTHER PUBLICATIONS

Huang, Jianzhong; Novel Processing of High–Tc Ceramic Superconducting Fibers Midwest Superconductor Consortium, Jul., 1993.

Primary Examiner—John Hoffmann
Attorney, Agent, or Firm—C. Michael Gegenheimer; Inger H. Eckert

[57] ABSTRACT

A hollow high temperature ceramic superconducting fiber (10, 100), a process for making the hollow fibers and an apparatus for carrying out the process are provided. The apparatus functions to simultaneously draw a molten superconducting material (16) and a molten glass material (18) into a hollow preform (25) which is heat treated to form a hollow superconducting fiber (10, 100) which is flexible and has a high electrical current carrying capacity. The glass cladding layer (14, 14') surrounds the hollow superconducting core (12).

12 Claims, 7 Drawing Sheets

METHOD OF MAKING HOLLOW HIGH TEMPERATURE CERAMIC SUPERCONDUCTING FIBERS

CROSS REFERENCE TO RELATED APPLICATIONS

This application is related to contemporaneously filed U.S. patent application Ser. No. 08/570,953, titled *"Method for Making Superconducting Fibers,"* by Jason Huang, having attorney docket number 23592, herein incorporated by reference

TECHNICAL FIELD

This invention relates to hollow high temperature ceramic superconducting fibers, a process for making the hollow fibers and an apparatus for carrying out the process.

BACKGROUND ART

The discoveries of high $T_c$ superconducting compositions which exhibit superconducting properties when cooled by relatively inexpensive liquid nitrogen have generated wide interest because of the potential of manufacturing devices which are much more efficient in their use of energy. However, while the potential remains, many problems exist in providing commercially applicable products which use such superconductors. One problem area is in the production of superconducting wires. An inherent problem is that ceramic superconducting compositions are brittle and fragile and cannot be easily formed into desired shapes. Another problem is that the superconducting compositions must be of sufficient density to carry a desired electrical current.

Although wire-shaped superconductors have been reported, the wires have been relatively short in length, have had poor current-carrying capabilities, and have lacked mechanical strength and flexibility. Ceramic superconductors are inherently brittle. Also, the viscosity of superconducting material in the molten state is very low, on the order of 1 poise. Thus, they lack the necessary strength and viscosity for suitable fiber formation.

One type of superconducting wire has been produced by the so called "powder-in-tube" technique. In this method, preformed hollow metal tubes are filled with heat-treated superconducting powders and then cold worked down to a desired diameter. After cold working, the wire is then heated to sinter the superconducting powder. However, a major drawback to this technique is that the density of the superconducting composition is low, resulting in a porous mass which has a low electrical current carrying capacity (i.e., $10^4$ amp/cm$^2$ or less).

In another prior art method, the superconducting material, in powder form, is mixed with an organic binder and extruded to form a thin wire shape. It is then fired to burn off the binder and sintered to turn the powder into a current carrying wire. However, once the organic binder is burned out, the wire becomes quite fragile and brittle.

Other attempts have been made to produce superconducting wires. Urano et al., U.S. Pat. Nos. 4,968,662 and 5,215,565, teach a method for producing superconducting wires by filling a pre-formed closed end glass tube with a powdered superconducting material and spinning the tube to form a wire. Boeke, U.S. Pat. No. 5,006,671, discloses forming a glass clad superconducting wire by filling a glass-lined metal cylinder with a powdered superconducting material, drawing the cylinder through progressively smaller dies, and then sintering the powder. Iijima et al., U.S. Pat. No. 5,037,800, teach a method of drawing a molten superconducting oxide encased in a softened glass outer layer through an elongated block to form a superconducting wire. Nagesh et al., U.S. Pat. No. 5,045,526, disclose a method which uses a tubular glass preform which is filled with a superconducting oxide powder, heating the glass to soften it, and then drawing the softened glass and powder into a wire.

Accordingly, the need exists in the art for a process for making a superconducting wire or fiber having the requisite density and micro-structure to carry an electrical current while also possessing the flexibility and strength to be used in commercial applications.

DISCLOSURE OF INVENTION

The present invention meets those needs by providing an apparatus for simultaneously drawing streams of molten superconducting and glass compositions into a hollow fiber to form a hollow superconducting fiber which is flexible and has a high electrical current carrying capacity.

In accordance with one aspect of the present invention, a process for making a hollow superconducting fiber is provided comprising the steps of: a) providing a first source of molten superconducting composition; b) providing a second source of molten glass composition; c) forming a hollow preform having a core portion formed of the superconducting composition and an outer layer portion formed of the glass composition; and d) heat treating the preform to form a hollow superconducting fiber having a superconducting core surrounded by a glass cladding layer.

The step of forming a hollow preform may comprise the steps of drawing streams of material from the first and second sources of the superconducting and glass compositions and ingesting air into the molten superconducting composition stream being drawn from the first source to thereby form a hollow preform. The step of heat treating the preform comprises heating the preform to a temperature of from about 700° to about 950° C. to convert the superconducting composition of the preform to a crystalline superconducting state.

The process may further include the steps of coating a surface of the hollow preform with a sizing composition prior to the heat treating step and compressing the heat treated preform. A polymeric or metallic coating may be applied over the glass cladding layer after the heat treating step.

Prior to the heat treating step, the preform may be heated to a temperature of from about 400° to about 650° C. to promote phase separation of the outer layer portion into at least two phases; one of the separated phases of the outer layer portion may be removed by chemically etching, such as by acid or plasma leaching, to form a microporous outer layer; and the microporous outer layer may be coated with a metal layer.

The superconducting composition is selected from the group consisting of a Bi-Sr-Ca-Cu-O ceramic, a Y-Ba-Cu-O ceramic, a Tl-Ba-Ca-Cu-O ceramic, and a Hg-Ba-Ca-Cu-O ceramic. The glass composition may comprise an alkali-boron-silicate glass.

According to another aspect of the present invention, a hollow superconducting fiber is provided comprising a core layer of a superconducting material surrounded by a glass cladding layer and including a bore which is defined at least in part by the core layer. The fiber may have a continuous length of at least about 1 kilometer. The glass cladding layer may be microporous having multiple channels passing through the glass cladding layer to the core layer of superconducting material and a metal conductive layer may surround the microporous glass cladding layer.

The hollow superconducting fiber may include superconducting planes aligned parallel to a longitudinal axis of the fiber and the fiber may have a substantially circular cross-section. A metallic or polymeric protective coating layer may be provided on an outer surface of the glass cladding layer, or on an outer surface of the metal conductive layer, if provided.

The superconducting composition is selected from the group consisting of a Bi-Sr-Ca-Cu-O ceramic, a Y-Ba-Cu-O ceramic, a Tl-Ba-Ca-Cu-O ceramic, and a Hg-Ba-Ca-Cu-O ceramic. The glass composition may comprise an alkali-boron-silicate glass.

According to a third aspect of the present invention, an apparatus for making a hollow superconducting fiber is provided comprising: a) a first crucible adapted to contain a molten superconducting composition, the first crucible having a first outlet portion through which a stream of the molten superconducting composition flows from the first crucible; b) a second crucible adapted to contain a molten glass composition, the second crucible having a second outlet portion which generally surrounds the first outlet portion and through which a stream of the molten glass composition flows from the second crucible; c) a gas supply conduit adapted to ingest gas into the molten superconducting composition flowing from the first outlet portion; d) a drawing device adapted to draw the streams of the superconducting and glass compositions into a hollow preform having a core portion formed of the superconducting composition and an outer layer formed of the glass composition; and, e) a heat treating station for heat treating the hollow preform to form a hollow superconducting fiber having a superconducting core surrounded by a glass cladding layer.

The conduit may be formed of either two perpendicularly oriented portions, one of the portions having two gas inlets and another of the portions having one gas outlet, or a single portion surrounding a single linear axis having one gas inlet and one gas outlet.

The apparatus may further comprise a polymeric or sizing composition applicator station, a glass composition phase separation heat treating station, a glass composition chemical etching station, a fiber compression station, and a fiber coating station.

Accordingly, it is a feature of the present invention to provide a hollow superconducting fiber and an apparatus and process for manufacturing a hollow superconducting fiber or wire. Other features and advantages of the invention will be apparent from the following description, the accompanying drawings and the appended claims.

BEST MODE FOR CARRYING OUT THE INVENTION

Figure 1A:
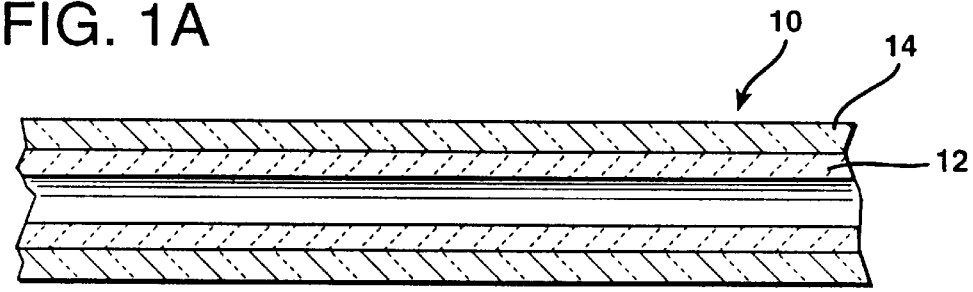
FIG. 1A is a cross-sectional side view of a superconducting wire or fiber according to a first embodiment of the present invention.

Turning to FIG. 1A, a superconducting wire or fiber 10 formed in accordance with the present invention is shown. The superconducting fiber 10 comprises a hollow core 12 of a superconducting material and an outer glass cladding layer 14. Typically, the thickness ratio of superconducting core 12 to glass cladding layer 14 ranges from about 1:1 to about 4:1. However, the present invention is not limited to these ratios and one of ordinary skill in the art will recognize that other ratios are also available. Typically, the inside diameter of the superconducting core 12 is less than 20 m, the thickness of superconducting material of the core 12 ranges from 5 m to 100 m, and the thickness of the outer glass cladding layer ranges from 5 m to 100 m. However, the present invention is not limited to these dimensions and one of ordinary skill in the art will recognize that other dimensions are also available.

Figure 2:
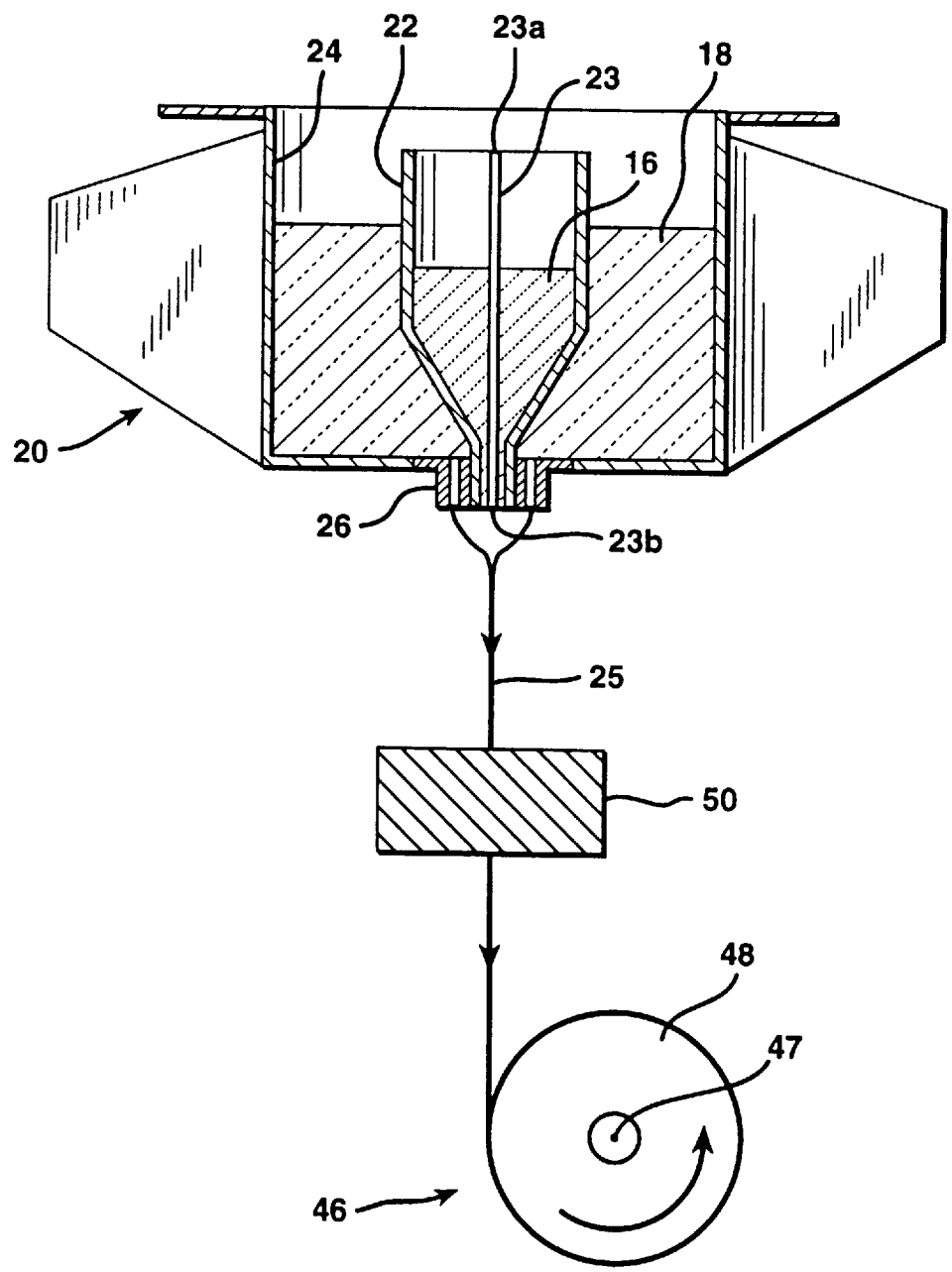
FIG. 2 is a somewhat schematic representation, partially in cross section, of an apparatus for forming a hollow preform according to the present invention.

Turning now to FIG. 2, the method of the present invention to produce superconducting fiber 10 involves melting a metal or ceramic superconducting composition 16 and a glass composition 18 in a double bushing 20 to provide respective first and second sources of molten superconducting and glass compositions. The metal or ceramic superconducting composition precursor 16 can be any composition known in the art which is capable of forming a high temperature superconductor.

High temperature superconductors, as intended in this application, are compositions which are superconductive when cooled to below their respective critical temperatures ($T_c$), all of which are higher than the temperature of liquid nitrogen or about 77° K. That is, the superconducting composition should be superconductive at about 77° K. or higher. Several high temperature superconducting systems are known and all can be employed in the present invention. Known systems include the Y-Ba-Cu-O (YBCO) system, the Bi-Sr-Ca-Cu-O (BISCCO) system, the Tl-Ba-Ca-Cu-O (TBCCO) system and the Hg-Ba-Ca-Cu-O (HBCCO) system. These systems are well known and documented in the prior art.

The superconducting composition precursor 16 may be prepared from readily available raw materials such as oxide and carbonate compounds of the individual components of the superconducting composition precursor. The oxide and carbonate compounds of the individual components are introduced into a first crucible 22 of the double bushing 20, thoroughly mixed therein, and melted by heat in the first crucible 22. The component mixture forms a homogenized superconducting composition precursor while in the molten state. Prior art processes, on the other hand, require the use of high quality superconducting powder compositions which are very expensive and, hence, dramatically increase production costs.

Glass composition 18 may be any glass composition which when melted has suitable properties for fiber drawing. Such compositions generally include those which when melted have a viscosity suitable for fiber drawing of about 200 to about 1000 poise over a reasonably wide temperature range (e.g., from about 1000° to about 1300° C.). In addition, the glass composition should have a suitable fiber drawing viscosity in the temperature range at which the selected superconducting material is completely molten. Typically, high temperature superconducting materials are completely molten in a temperature range of about 1000° to about 1300° C. and preferably about 1100° to about 1200° C. Thus, the glass composition should have a viscosity of about 200 to about 1000 poise at a temperature of from about 1000° to about 1300° C. and preferably at about 1100° to about 1200° C.

Preferably, glass composition 18 is an alkali-boron-silicate glass composition. More preferably, the glass composition 18 comprises from about 70 to about 80% silicate, from about 15 to about 25% boron and from about 0% to about 10% alkali. As will be discussed more explicitly below with regard to the second embodiment of the present invention, alkali-boron-silicate glass compositions phase separate after annealing at relatively low temperatures of about 500° C. This phase separation provides an alkali-boron rich phase which can be easily removed by leaching and an inert strong silicate phase which is resistant to leaching. A microporous outer cladding layer is then provided with micropores or channels being formed by the removal of the alkali-boron phase of the glass. A microporous outer cladding layer can be beneficial as will be discussed below. Glass composition 18 can also be prepared from readily available raw materials. One example of a suitable glass composition 18 for the present invention comprises 75 weight % $SiO_2$, 20 weight % $B_2O_3$ and 5 weight % $Na_2O$.

The raw materials forming the superconducting composition 16 and the glass composition 18 are melted in the double-bushing 20, see FIG. 2. Double-bushing 20 comprises the first crucible 22 which is located within a second crucible 24. A gas conduit 23 is located in the first crucible 22. Molten superconducting composition 16 is held in first crucible 22 while molten glass composition 18 is held within second crucible 24. The gas conduit 23 includes openings at inlet end 23a and outlet end 23b. Inlet end 23a is exposed to a supply of gas containing oxygen, e.g., air. Streams of molten superconducting and glass compositions discharged from first and second outlet portions 42 and 44 of the first and second crucibles 22 and 24 (see FIG. 4A) are drawn so as to form a fiber preform 25 which, as will be discussed below, is heat treated to form fiber or wire 10.

During drawing, a pressure differential is generated between ends 23a and 23b. The pressure differential results in aspiration of gas into the stream 116 of the superconducting material 16. The streams 116 and 118 converge toward one another below the bushing tip 26. The molten compositions then cool to form fiber preform 25 which, in the illustrated embodiment, comprises a hollow superconducting composition core portion in contact with a glass composition outer layer portion. The inlet end 23a of the gas conduit 23 may be exposed to the ambient air or may be coupled to an oxygen gas supply (not shown) in order to introduce oxygen into the stream 116 of the superconducting material 16.

Some superconducting materials, such as the YBCO system, require the presence of oxygen during an annealing stage, described below in the discussion of FIG. 7, in order to convert the material forming the superconducting composition core portion from an amorphous state to a superconducting crystalline state. The gas introduced into the stream 116 of the superconducting material 16 provides the oxygen necessary during the annealing stage. It is contemplated that a gas not containing oxygen could be used to form the hollow superconducting composition core portion if the time period between the formation of the hollow core portion and the annealing stage is of sufficient duration to permit oxygen from the ambient air to replace the gas not containing oxygen in the hollow core portion. It is further contemplated that a gas not containing oxygen could be used to form the hollow core portion if an oxygen containing gas is introduced into the hollow core portion prior to the annealing stage to replace the gas not containing oxygen.

Fiber preform 25 may have a fiber diameter in the range of about 10 to about 200 μm. The small diameter allows fiber preform 25 to cool at a very high rate of about 100,000° C./sec. The fast cooling rate of fiber preform 25 minimizes interaction between superconducting composition 16 and the glass composition 18 during fiberization. This assures the stoichiometric composition of superconducting core 12. In addition, the high cooling rate prevents the crystallization and growth of non-superconducting phases in the hollow superconducting core portion which can be present with slower cooling rates. Non-superconducting phases must be remelted and/or reacted in order to be converted to a superconducting state. Thus, the elimination of non-superconducting phases allows essentially all of the superconducting composition 16 forming the core portion to be converted to the superconducting phase.

Figure 3:
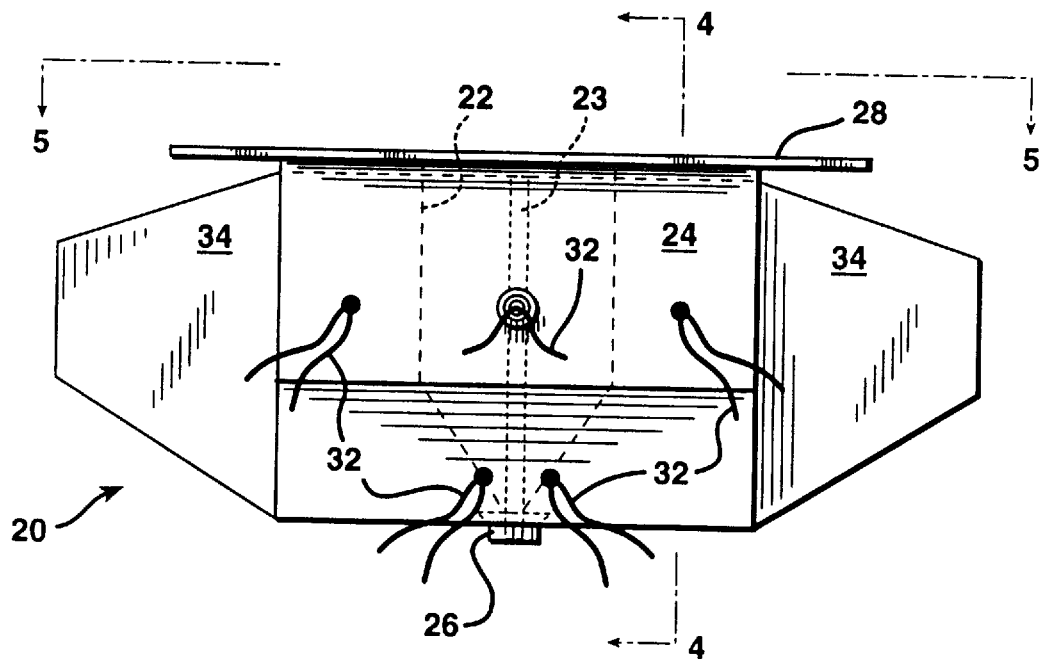
FIG. 3 is a front view of the double-bushing shown in FIG. 2.
Figure 5:
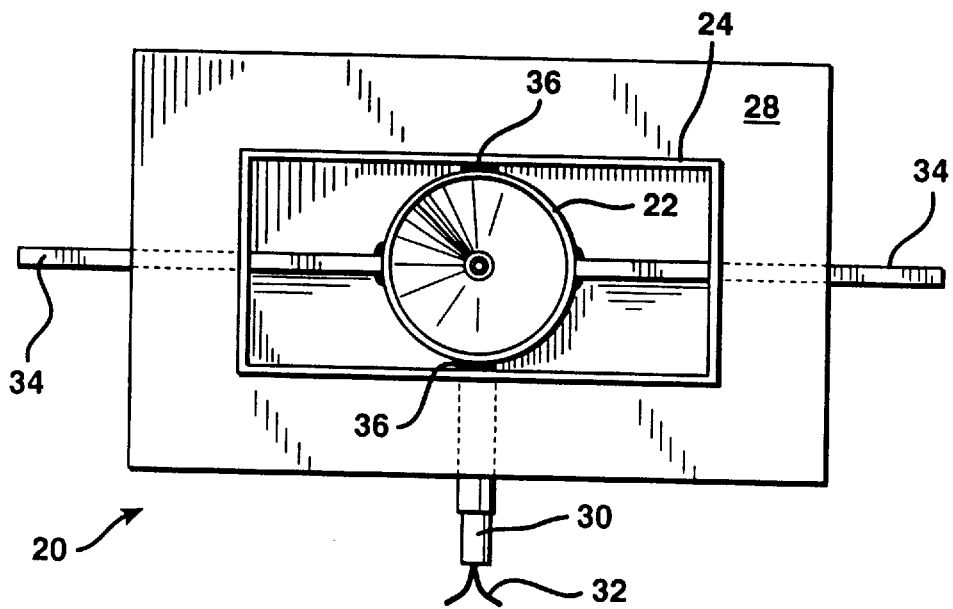
FIG. 5 is a view taken along view line 5—5 in FIG. 3.
Figure 4:
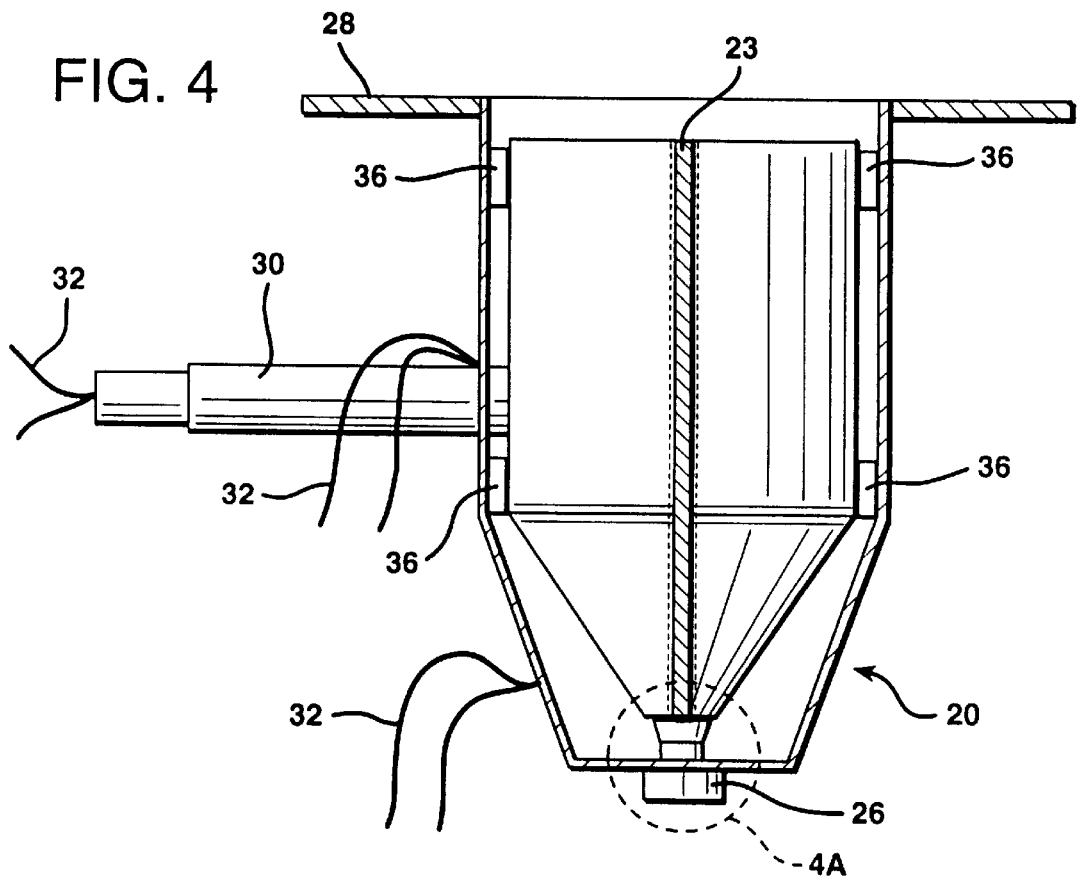
FIG. 4 is a view taken along view line 4—4 in FIG. 3.

Turning to FIGS. 3–5, double-bushing 20 is shown in greater detail. As noted previously, double-bushing 20 comprises first crucible 22, second crucible 24, gas conduit 23, and bushing tip 26. Double-bushing 20 also includes rim plate 28 surrounding the perimeter of second crucible 24, thermocouple wires 32 coupled to thermocouples which measure the temperature of the first and second crucibles 22 and 24 in various locations, ceramic tube 30 which passes through second crucible 24 and is attached to first crucible 22 and through which the wires 37 extend, and heating plates 34 for heating the first and second crucibles 22 and 24. The heating plates 34 may be resistively heated. It is also contemplated by the present invention that the crucibles may be heated by any other conventional heating means. For example, the double bushing 20 may be heated by placing it in the interior of a furnace (not shown). Double-bushing 20 also includes tack welds 36 to secure first crucible 22 to second crucible 24.

Figure 4A:
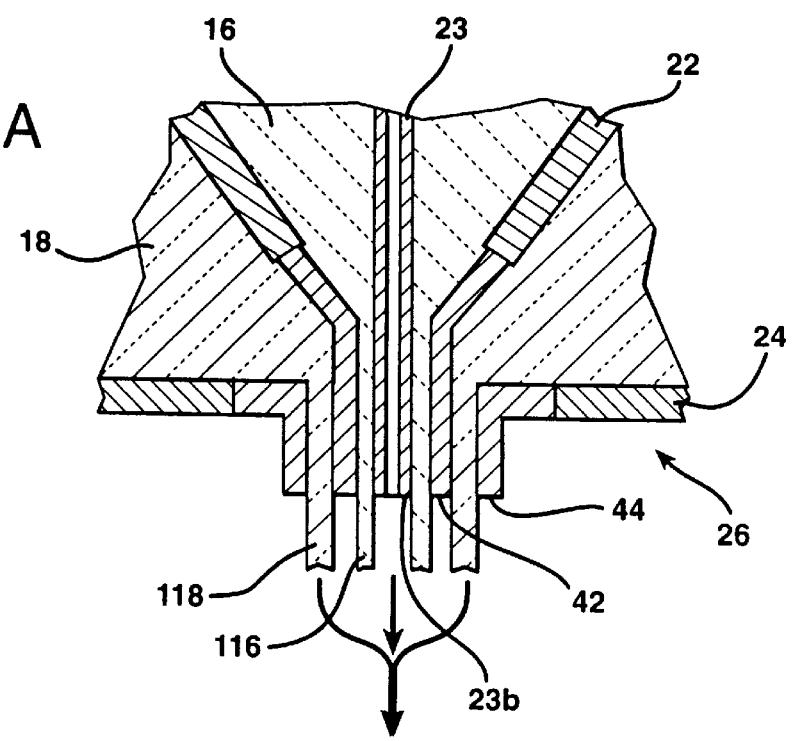
FIG. 4A is an enlarged cross-sectional side view of the tip on the double-bushing of FIG. 4.
Figure 6:
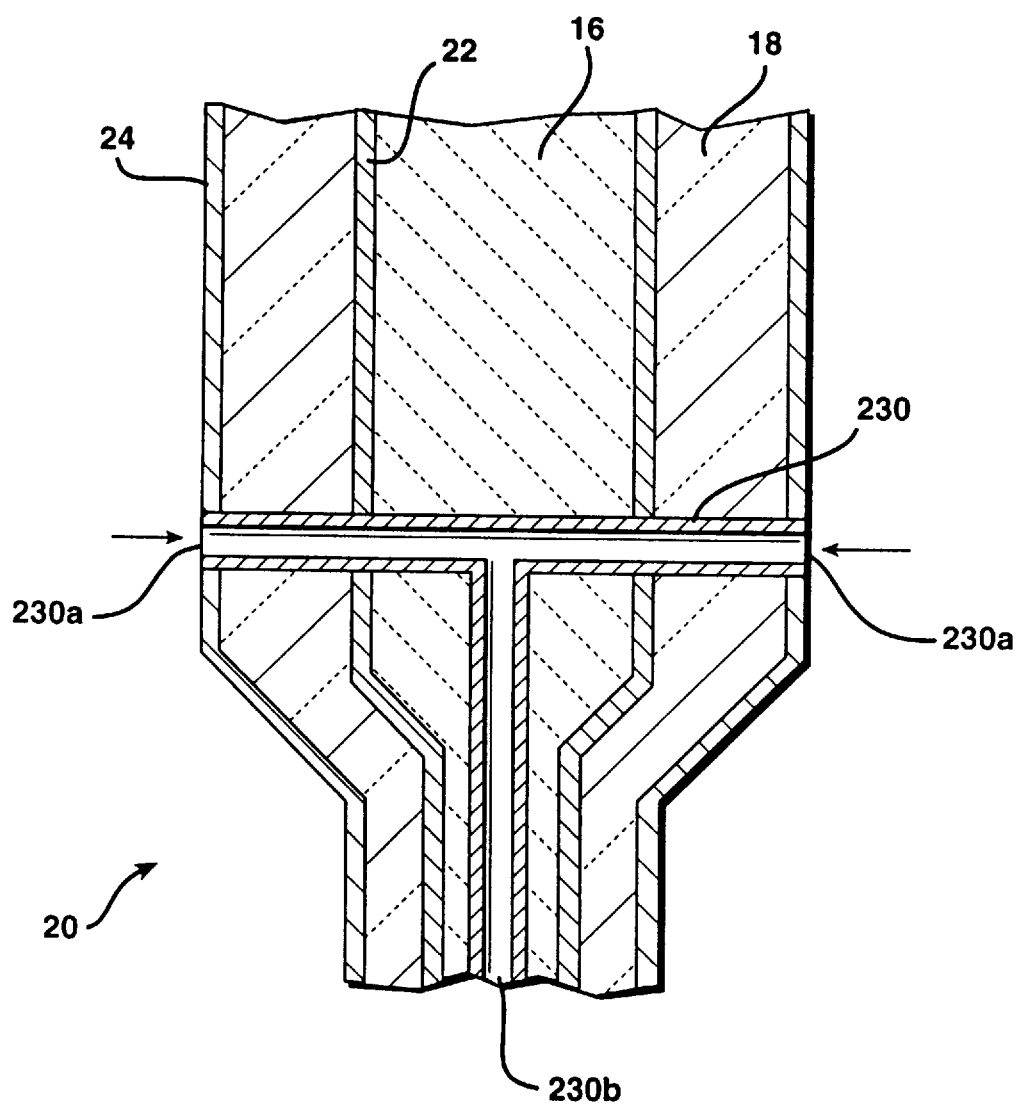
FIG. 6 is a cross-sectional side view of a double bushing including a T-shaped gas conduit.

Referring to FIG. 4A, bushing tip 26 includes the first outlet portion 42 of the first crucible 22 and the second outlet portion 44 of the second crucible 24. Preferably, first outlet portion 42, second outlet portion 44 and outlet end 23b of the gas conduit 23 are aligned so that they terminate in the same plane. Turning now to FIG. 6, where like elements are referenced by like reference numerals, an alternative embodiment is illustrated utilizing a T-shaped gas conduit 230 in place of the substantially linear gas conduit 23 illustrated in FIGS. 2–5. The T-shaped gas conduit 230 includes two gas inlets 230a and one gas outlet 230b. A supply of gas is provided at each gas inlet 230a.

Preferably, the gas conduit outlet 23b, 230b is positioned within the double bushing 20 such that a bore is formed centrally within the superconducting composition core portion of the preform 25. Similarly, it is contemplated by the present invention that the preform 25 may include a bore which is defined only in part by the superconducting composition core portion. For example, the gas conduit 23, 230 may be positioned to aspirate gas adjacent to the stream of the superconducting composition, i.e., between the superconducting and glass composition streams. The resulting preform includes a bore defined by a portion of the glass composition outer layer portion and a portion of the superconducting composition core portion.

Returning to FIG. 2, fiber preform 25 is drawn from bushing tip 26 through tension applied from winder or drawing device 46. Winder or drawing device 46 may comprise any standard winding device well-known in the art of glass fiber formation. Winder or drawing device 46 winds preform 25 around a winding drum or spool 47 to form a wound package 48. Such winders generally comprise a winding drum 47 rotated by a variable speed motor (not shown). The winder 46 may be a standard textile winder commercially available from a number of sources. One example of a suitable winding device is model number 966 winder available from Leesona Textile machinery of Burlington, N.C.

A polymeric or sizing composition is applied at an applicator station 50 to a surface of the preform 25 before preform 25 is passed to winder 46, see FIG. 2. The sizing composition may be applied via conventional sizing application technology such as by spraying, electrostatic attraction or various other application methods such as roll application commonly used in commercial silicate fiber manufacturing. The sizing composition may comprise conventional sizing compositions which are commercially available from a number of suppliers. Conventional sizing compositions which may be employed in the present invention include those having lubricants, film forming agents, anti-static agents and various other property imparting components. Coupling agents typical in most sizing compositions to bind coated fibers to a polymer matrix can also be included.

Figure 7:
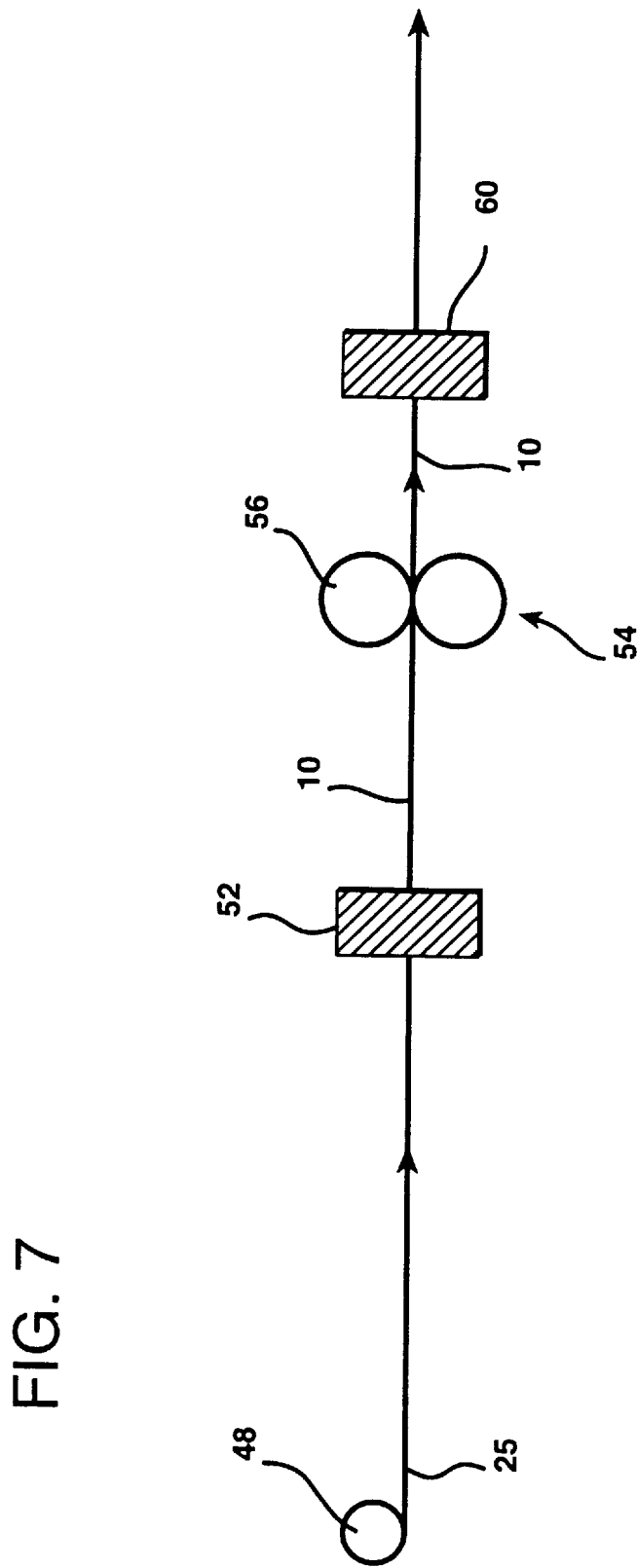
FIG. 7 is a schematic representation of the process of converting a hollow preform to the superconducting fiber of the present invention, according to a first embodiment of the present invention.

Turning now to FIG. 7, various steps performed to transform the fiber preform 25 to a superconducting fiber 10 will now be described. While the process of the present invention may comprise a continuous process, the process will be described as a process wherein the fiber preform 25 is wound via a winder 46 to form a wound package 48, as shown in FIG. 2, and subsequently unwound prior to passing through additional processing stations including a heat treating station 52. Of course, one of ordinary skill in the art will recognize that the process of the present invention can be conducted as a continuous or in-line process.

After formation of the fiber preform 25, the superconducting composition core portion is in an amorphous state and does not yet possess superconducting properties. To convert the core portion from its amorphous state to a crystalline state capable of superconducting properties, the preform 25 must be annealed or heated at high temperatures. Thus, the fiber preform 25 is directed through a heat treating station 52 comprising a conventional heating apparatus such as a gas forced oven or furnace.

As noted previously, the fiber preform 25 has a small diameter which allows uniform heat distribution throughout the superconducting composition core portion during annealing and allows essentially complete crystallization of the core portion. In addition, the preform experiences a high rate of cooling due to its small fiber diameter which prevents the formation of non-superconducting phases in the core portion during the cooling process.

During annealing at the heat treating station 52, the fiber preform 25 is heated to a temperature in the range of about 700° to about 950° C., depending on the superconducting system employed to convert the superconducting core portion of the fiber preform 25 to a crystalline superconducting state.

To achieve a high current carrying capacity, it is preferable to have the Cu-O planes, i.e., the superconducting a-b planes, aligned to be parallel to the current carrying direction, i.e., along the longitudinal axis of the fiber. The fiber longitudinal axis is essentially parallel to the direction in which the preform is drawn from the bushing tip 26. As discussed above and illustrated in FIG. 2, a downward drawing force is applied to the superconducting and glass material streams so as to form the preform 25. This downward force applied to the streams naturally aligns the superconducting planes along the drawing direction or longitudinal fiber axis.

To help assure that the superconducting planes are aligned along the fiber axis, the superconducting fiber 10, in the illustrated embodiment, is passed through a fiber compression station 54, see FIG. 7. The compression station 54 comprises a pair of compression rollers or drums 56 which apply pressure to the fiber 10 while the fiber 10 is still hot after passing from the heat treating station 52. The pressure applied to the fiber 10 further aligns the superconducting planes along the longitudinal fiber axis. Pressure ranging from a few psi to several hundred psi may be applied to fiber 10.

Figure 1B:
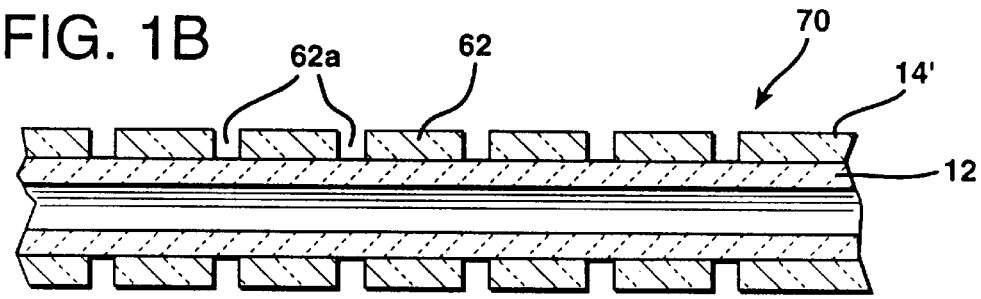
FIG. 1B is a cross-sectional side view of a superconducting wire or fiber according to a second embodiment of the present invention, but prior to receiving an outer coating layer.

To provide strength and support to fiber 10 as well as protect glass cladding layer 14, a coating layer 59 (shown in FIG. 1D) is applied to glass cladding layer 14 at a fiber coating station 60, see FIG. 7. Coating layer 59 prevents microcracking in the glass cladding layer and prevents moisture degradation. Coating layer 59 may comprise any suitable material for protecting a glass cladding layer, such as, for example, a polymer coating or a metallic coating. Specific examples of protective coating materials include, low melting point alloys, such as tin-based and aluminum based alloys, and a polyester resin.

A fiber 100 formed in accordance with a second embodiment of the present invention will now be described with reference to FIGS. 1C and 8. The fiber 100 includes an electrically conductive coating 58 surrounding a microporous glass cladding layer 14' and extending through pores 62a in cladding layer 14' to the hollow superconducting core 12. Preferably, coating 58 is a metallic coating.

Figure 1C:
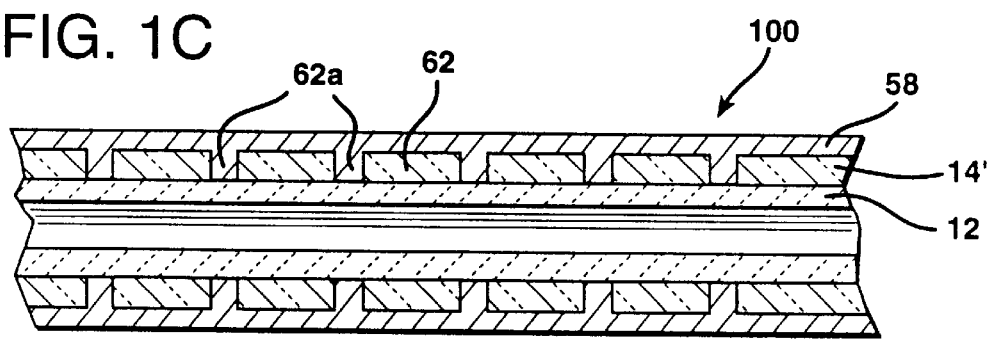
FIG. 1C is a cross-sectional side view of the superconducting wire or fiber shown in FIG. 1B after receiving the outer coating layer.
Figure 1D:
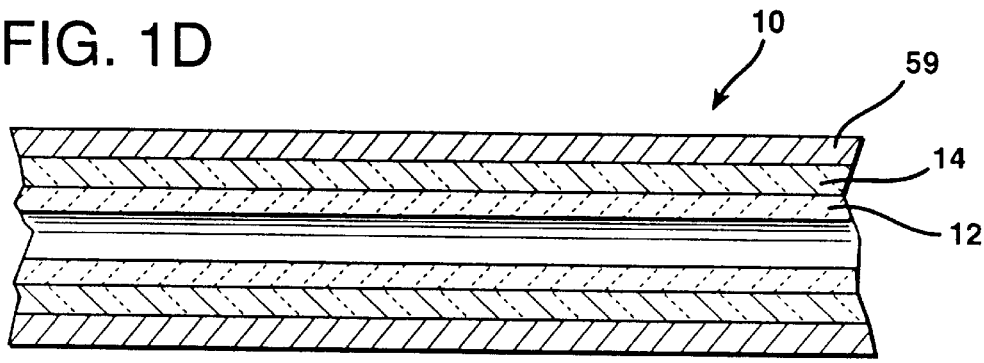
FIG. 1D is a cross-sectional side view of the superconducting wire or fiber shown in FIG. 1 with an outer protective layer thereon.

To form the fiber 100 illustrated in FIG. 1C, a glass composition is selected that is capable of phase separation. Phase separation, as used herein, means converting the glass composition to an inert phase and a chemically active phase. The chemically active phase may then be removed by a chemical treatment step leaving behind the inert phase. This treatment creates a microporous outer glass layer portion in the preform.

To form the fiber 100, a hollow preform 25, drawn as described above, is passed through a glass composition phase separation heat treating station 64 where it is heated to a temperature of from about 400° to about 650° C., and preferably about 500° C. The treating station 64 comprises a conventional heating apparatus such as a gas forced oven or furnace. The heat to which the preform 25 is exposed in the station 64 causes the desired phase separation in the glass composition outer layer portion, resulting in a phase separated preform 66. Where the glass composition outer layer portion is formed from an alkali-boron-silicate glass composition, the glass outer layer portion separates into a chemically active boron rich phase and an inert silica rich phase.

To remove the chemically active phase and create a microporous glass outer layer portion, phase separated preform 66 is passed through a chemical treatment station 68, where the chemically active phase is removed such that a porous preform 70 is formed. Chemical treatment station 68 removes the chemically active phase from phase separated preform 66 by a leaching step wherein the chemically active phase is leached from the phase separated preform 66. Preferably, chemical treatment station 68 comprises a bath of an acidic solution (not shown). The phase separated preform 66 is placed in or passed through the bath of the acidic solution. It is also contemplated that various other leaching techniques such as plasma leaching may also be employed.

The acidic solution may comprise any common acidic solution but is preferably a mineral acid solution and most preferably a solution of hydrochloric acid. The length of time required to remove the chemically active phase in chemical etching station 68 will vary depending upon the concentration of the acid, the temperature of the acid, and the chemically active species being removed. Preferably, a dilute solution of about 0.1 to about 5 weight % of hydrochloric acid is employed at a temperature of about 100° C. for a period of time ranging from one or more minutes to one or more hours depending on the thickness of the glass outer layer portion.

Following the chemical treatment at chemical treatment station 68, the preform 70 is passed through heat treating station 52 and compression station 54, which are substantially identical to those illustrated in FIG. 7 and described above. During annealing at the heat treating station 52, the preform 70 is heated to a temperature in the range of about 700° to about 950° C., depending on the superconducting system employed to convert the superconducting material core portion of the fiber preform 70 to a crystalline superconducting state. To help assure that the superconducting planes are aligned along the fiber axis, the superconducting fiber 100, in the illustrated embodiment, is passed through the fiber compression station 54.

From the fiber compression station 54, the fiber 100 passes through a fiber coating station where a metallic coating 58 is applied, such as by a conventional sputtering technique or preferably by passing the wire 100 through a bath of molten metal. The metallic coating 58 may be any suitable low melting point metal and is preferably a metal having good conductive capabilities. Suitable metals include aluminum and indium both of which are molten at less than about 600° C. Of course, one of ordinary skill in the art will recognize that various other low melting, conductive metals may also be employed.

The conductive coating 58 penetrates the pores or channels 62a in the glass cladding layer 14'. Therefore, coating 58 is capable of acting as a shunt within the fiber 100. In other words, should the hollow superconducting core 12 of fiber 100 become damaged such that a break or gap is created in the core 12, metallic coating 58 creates a means for current to bypass the gap or break thereby allowing fiber 100 to continue to carry current.

It should be noted that, although FIGS. 1B and 1C show a substantially uniform porosity for ease of illustration, the microporous glass cladding layer 14' created according to the present invention is not necessarily created with equally spaced apart pores or channels 62a as depicted in FIGS. 1B and 1C.

Figure 8:
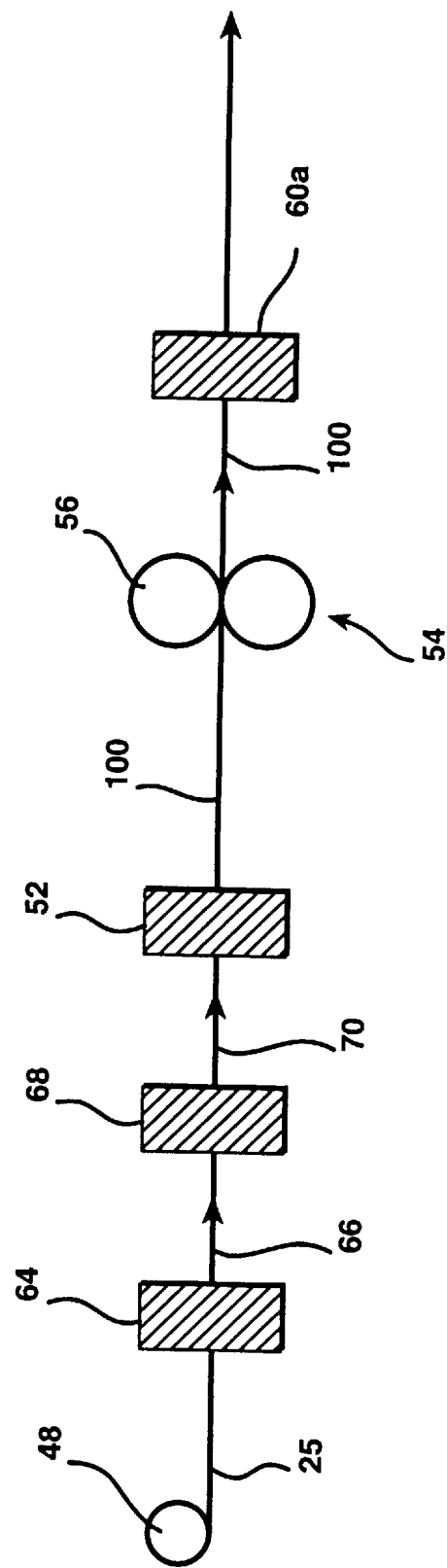
FIG. 8 is a schematic representation of the process of converting the hollow preform to the superconducting fiber of the present invention, according to a second embodiment of the present invention.

To provide strength and support to fiber 100 as well as protect glass cladding layer 14' and conductive layer 58, a further polymeric or metallic coating may also be applied at the fiber coating station 60a where the metallic coating 58 is applied, see FIG. 8, or at a separate coating station (not shown).

Thus, the present invention provides a hollow superconducting fiber or wire 10, 100 having a high level of flexibility due to its small diameter of preferably from about 10 to about 200 µm. Accordingly, the superconducting fiber of the present invention can easily be wrapped about small cylinders to form coils for motors. In addition, the superconducting wire of the present invention has a high current carrying capacity of at least about $10^4$ amps/sq.cm. and a high level of mechanical strength.

The superconducting fibers or wires 10 and 100 of the present invention can be formed to lengths of at least about 1 kilometer (km), more preferably at least about to 5 kilometers (km) and even greater than about 10 kilometers (km). To create a fiber or wire 10, 100 having a predetermined length, it is preferable to cut the wire after the final processing step, e.g, fiber coating at station 60, 60a. However, it should also be noted that the preform 25 can be cut to a discrete length prior to either of the heat treating stations 52, 64. In addition, the fibers 10 and 100 may have a substantially circular cross-section at these lengths.

Having described the invention in detail and by reference to preferred embodiments thereof, it will be apparent that modifications and variations are possible without departing from the scope of the invention which is defined in the appended claims.

I claim:

1. A process of making a hollow superconducting fiber comprising the steps of:

providing a bushing including a first source of molten superconducting composition precursor, a second source of molten glass composition, and a gas conduit, wherein said gas conduit is positioned within said first source of molten material;

forming a hollow preform having a core portion formed of the superconducting composition precursor and an outer layer portion formed of the glass composition by drawing said molten superconducting composition precursor from said first source such that said molten superconducting composition precursor comprises a hollow core portion, by drawing said glass composition from said second source of molten material, and by cooling said molten compositions to form said hollow preform; and heat treating the hollow preform to form a hollow superconducting fiber having a superconducting core surrounded by a glass cladding layer.

2. The process as claimed in claim 1, wherein a gas is ingested into the molten superconducting composition as it is being drawn from said first source.

3. The process as claimed in claim 2, wherein said gas contains oxygen.

4. The process as claimed in claim 1, wherein said step of heat treating the preform comprises heating the preform to a temperature of from about 700° to about 950° C.

5. The process as claimed in claim 1, further including the step of coating a surface of the hollow preform with a sizing composition prior to said heat treating step.

6. The process as claimed in claim 1, further including the step of compressing the heat treated preform.

7. The process as claimed in claim 1, further including the step of applying a polymeric or metallic coating over said glass cladding layer after said heat treating step.

8. The process as claimed in claim 1, further including the steps of, prior to said heat treating step:
   a) heating the preform to promote phase separation of said outer layer portion into at least two outer sub-layer portions characterized by two distinct phases;
   b) removing substantially all of one of said outer sub-layer portions by chemically etching said outer layer portion to form a microporous outer layer portion; and
   c) coating the microporous outer layer portion with a metal layer.

9. The process as claimed in claim 8, wherein the phase separation is promoted by heating the preform to a temperature of from about 400° to about 650° C. and the chemical etching is performed through acid or plasma leaching.

10. The process as claimed in claim 8, in which said superconducting composition precursor is selected from the group consisting of a Bi-Sr-Ca-Cu-O ceramic, a Y-Ba-Cu-O ceramic, a Tl-Ba-Ca-Cu-O ceramic, and a Hg-Ba-Ca-Cu-O ceramic.

11. The process as claimed in claim 8, wherein said glass composition is an alkali-boron-silicate glass composition.

12. A process of making a hollow superconducting fiber comprising the steps of:
   providing a molten superconducting composition precursor in a first crucible and causing a stream of said molten superconducting composition precursor to flow from a first outlet portion of said first crucible;
   providing a molten glass composition in a second crucible and causing a stream of molten glass composition to flow from a second outlet portion of said second crucible generally surrounding said first outlet portion of said first crucible;
   ingesting gas through a gas supply conduit positioned in said molten superconducting composition precursor and through said first outlet portion of said first crucible;
   forming a hollow preform having a core formed from said stream of molten superconducting composition precursor and an outer layer formed from said stream of molten glass composition; and,
   heat treating said hollow preform to form a superconducting fiber having a superconducting core surrounded by a glass cladding layer.

* * * * *